(12) United States Patent
Ahn et al.

(10) Patent No.: US 11,424,287 B2
(45) Date of Patent: Aug. 23, 2022

(54) LIGHT EMITTING DIODE INTEGRATED WITH TRANSITION METAL DICHALCOGENIDE TRANSISTOR AND METHOD FOR MANUFACTURING THE SAME

(71) Applicant: UIF (University Industry Foundation), Yonsei University, Seoul (KR)

(72) Inventors: Jong-Hyun Ahn, Seoul (KR); Anh Tuan Hoang, Seoul (KR); Luhing Hu, Seoul (KR)

(73) Assignee: UIF (University Industry Foundation), Yonsei University, Seoul (KR)

(*) Notice: Subject to any disclaimer, the term of this patent is extended or adjusted under 35 U.S.C. 154(b) by 30 days.

(21) Appl. No.: 17/228,723

(22) Filed: Apr. 13, 2021

(65) Prior Publication Data
US 2022/0199674 A1      Jun. 23, 2022

(30) Foreign Application Priority Data
Dec. 17, 2020  (KR) ................ 10-2020-0177014

(51) Int. Cl.
*H01L 27/15* (2006.01)
*H01L 33/32* (2010.01)
(Continued)

(52) U.S. Cl.
CPC .......... *H01L 27/15* (2013.01); *H01L 21/0262* (2013.01); *H01L 21/02568* (2013.01);
(Continued)

(58) Field of Classification Search
CPC .......... H01L 21/02485; H01L 21/0254; H01L 21/02568; H01L 21/0262; H01L 21/823412; H01L 27/15; H01L 27/156; H01L 29/24; H01L 29/66969; H01L 29/78696; H01L 33/007; H01L 33/06;
(Continued)

(56) References Cited

U.S. PATENT DOCUMENTS

2015/0279902 A1    10/2015   Von Malm et al.
2017/0092807 A1*   3/2017    Okuno ............... H01L 33/0025

FOREIGN PATENT DOCUMENTS

| KR | 10-1785644 B1 | 10/2017 |
| KR | 10-2019-0071277 A | 6/2019 |
| KR | 10-2158510 B1 | 9/2020 |

OTHER PUBLICATIONS

Zhao Jun Liu, et al., "Monolithic Integration of AlGaN/GaN HEMT on LED by MOCVD", IEEE Electron Device Letters 35.3 (2014), p. 330-332, IEEE, 3 pages.
Hyo-Min Kim, et al., "High Brightness Active Matrix Micro-LEDs with LTPS TFT Backplane", SID Symposium Digest of Technical Papers/vol. 49, Issue 1, May 30, 2018, 6 pages, Retrieved from the Internet: <URL: https://doi.org/10.1002/sdtp.12238>.
(Continued)

*Primary Examiner* — Cheung Lee
(74) *Attorney, Agent, or Firm* — Park, Kim & Suh, LLC

(57) ABSTRACT

The inventive concept relates to a light emitting diode integrated with a transition metal dichalcogenide-based transistor and capable of simultaneously fabricating the transistor to have a monolithic integration structure. The transition metal dichalcogenide is formed on the light emitting diode device, thereby providing the light emitting diode integrated with the transistor without affecting the characteristics of the light emitting diode device.

16 Claims, 9 Drawing Sheets

(51) Int. Cl.
  *H01L 33/62* (2010.01)
  *H01L 29/24* (2006.01)
  *H01L 33/00* (2010.01)
  *H01L 21/02* (2006.01)
  *H01L 29/66* (2006.01)
  *H01L 29/786* (2006.01)

(52) U.S. Cl.
  CPC ............ *H01L 27/156* (2013.01); *H01L 29/24* (2013.01); *H01L 29/66969* (2013.01); *H01L 29/78696* (2013.01); *H01L 33/007* (2013.01); *H01L 33/32* (2013.01); *H01L 33/62* (2013.01); *H01L 2933/0066* (2013.01)

(58) Field of Classification Search
  CPC ......... H01L 33/08; H01L 33/32; H01L 33/62; H01L 51/50; H01L 51/5008; H01L 51/5012; H01L 51/52; H01L 2933/0066
  See application file for complete search history.

(56) References Cited

OTHER PUBLICATIONS

Zhaojun Liu, et al., "Selective epitaxial growth of monolithically integrated GaN-based light emitting diodes with AlGaN/GaN driving transistors", Applied Physics Letters 104.9 (2014): 091103, AIP Publishing, 5 pages, Retrieved from the Internet: <URL: https://dx.doi.org/10.1063/1_4867235>.

Yafei Fu, et al., "Monolithic Integrated Device of GaN Micro-LED with Graphene Transparent Electrode and Graphene Active-Matrix Driving Transistor", Materials 12.3 (2019): 428, 8 pages.

Ya-Ju Lee, et al., "Monolithic integration of GaN-based light-emitting diodes and metal-oxide-semiconductor field-effect transistors", Applied Physics Letter 102.19 (2013): 192107, Oct. 1, 2014, 13 pages, Retrieved from the Internet: <URL: https://doi.org/10.1063/1_4807125>.

Ya-Ju Lee, et al., "Monolithic integration of GaN-based light-emitting diodes and metal-oxide-semiconductor field-effect transistors", Optics express 22.106 (2014): A1589-A1595, Oct. 20, 2014. 9 pages, Retrieved from the Internet: <URL: pubmed.ncbi.nlm.nih.gov/25607316/>.

\* cited by examiner

LIGHT EMITTING DIODE INTEGRATED WITH TRANSITION METAL DICHALCOGENIDE TRANSISTOR AND METHOD FOR MANUFACTURING THE SAME

CROSS-REFERENCE TO RELATED APPLICATIONS

A claim for priority under 35 U.S.C. § 119 is made to Korean Patent Application No. 10-2020-0177014 filed on Dec. 17, 2020, in the Korean Intellectual Property Office, the entire contents of which are hereby incorporated by reference.

BACKGROUND

Embodiments of the inventive concept described herein relate to a light emitting diode integrated with a transition metal dichalcogenide-based transistor and capable of simultaneously fabricating the transistor to have a monolithic integration structure.

Generally, light emitting diode devices on sapphire or silicon (Si) wafer and backplane transistor array, which is fabricated on different substrate, are assembled using transfer process to yield micro led display.

Due to this, not only production cost increases, but also it becomes difficult to align the transistors and the light emitting diodes during mass transfer as the micro LED pixels become smaller.

In addition, to this end, for monolithically integrating the light emitting diode with driving transistor, there are studies on integrating a gallium nitride high electron mobility transistor (GaN HEMT) device (2Volume 35, Issue 3, March 2014, Article number 6730671, Pages 330-332) or a low temperature poly silicon (LTPS) transistor device with a light emitting diode.

However, the gallium nitride HEMT device requires complex epitaxial growth, and high power consumption to drive the device, and hence, it is not suitable to be applied for low power driving transistors of a display.

A separate excimer laser annealing (ELA) process should be performed to integrate the LTPS transistor on the light emitting diode device, and therefore, production cost increases and the ELA affects the characteristics of the multi quantum wells (MWQs) of the light emitting diode.

SUMMARY

Embodiments of the inventive concept provide a light emitting diode integrated with a transistor, which reduces the production cost and does not affect the characteristics of the light emitting diode, and a method of manufacturing the same.

According to an exemplary embodiment, a light emitting diode integrated with a transistor includes a light-emitting stacked structure based on gallium nitride (GaN), a first insulating layer formed on the light emitting stacked structure, and a transition metal dichalcogenide transistor formed on the first insulating layer.

The transition metal dichalcogenide transistor includes a transition metal dichalcogenide active layer formed on the first insulating layer, a drain electrode formed on the transition metal dichalcogenide active layer, a source electrode formed on the transition metal dichalcogenide active layer, a second insulating layer formed on the transition metal dichalcogenide active layer and covering the drain electrode and the source electrode, and a gate electrode formed on the second insulating layer.

The light-emitting stacked structure based on gallium nitride (GaN) may include a substrate, a first GaN layer formed on the substrate, a first electrode formed in a region on the first GaN layer, a light-emitting active layer formed in another region on the first GaN layer, a second GaN layer formed on the light-emitting active layer, and a second electrode formed in a region on the second GaN layer.

The transition metal dichalcogenide active layer may include at least one material selected from a group consisting of molybdenum disulfide ($MoS_2$), molybdenum diselenide ($MoSe_2$), and tungsten diselenide ($WSe_2$), molybdenum ditelluride ($MoTe_2$), and tin diselenide ($SnSe_2$).

According to an exemplary embodiment, a method of manufacturing a light emitting diode integrated a transistor includes preparing a gallium nitride (GaN) stacked structure in which a substrate, a first GaN layer, a light-emitting active layer, and a second GaN layer are sequentially stacked, forming a first insulating layer on the second GaN layer, providing a semiconductor stacked structure in which a transition metal dichalcogenide active layer is formed on the first insulating layer by using MOCVD method, etching a part of a top of the first GaN layer, a part of a top of the second GaN layer, and a part of a top of the first insulating layer of the gallium nitride stacked structure using mesa etching to expose the first GaN layer, forming a first electrode on the exposed region of the first GaN layer, a second electrode on the exposed region of the second GaN layer, and a drain electrode and a source electrode which are separated from each other on the transition metal dichalcogenide active layer, forming a second insulating layer for covering the first electrode, the second electrode, the drain electrode, the source electrode, and an upper region of the semiconductor stacked structure, and forming a gate electrode on the second insulating layer.

The forming of the transition metal dichalcogenide active layer may be carried out at 700° C. or less.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
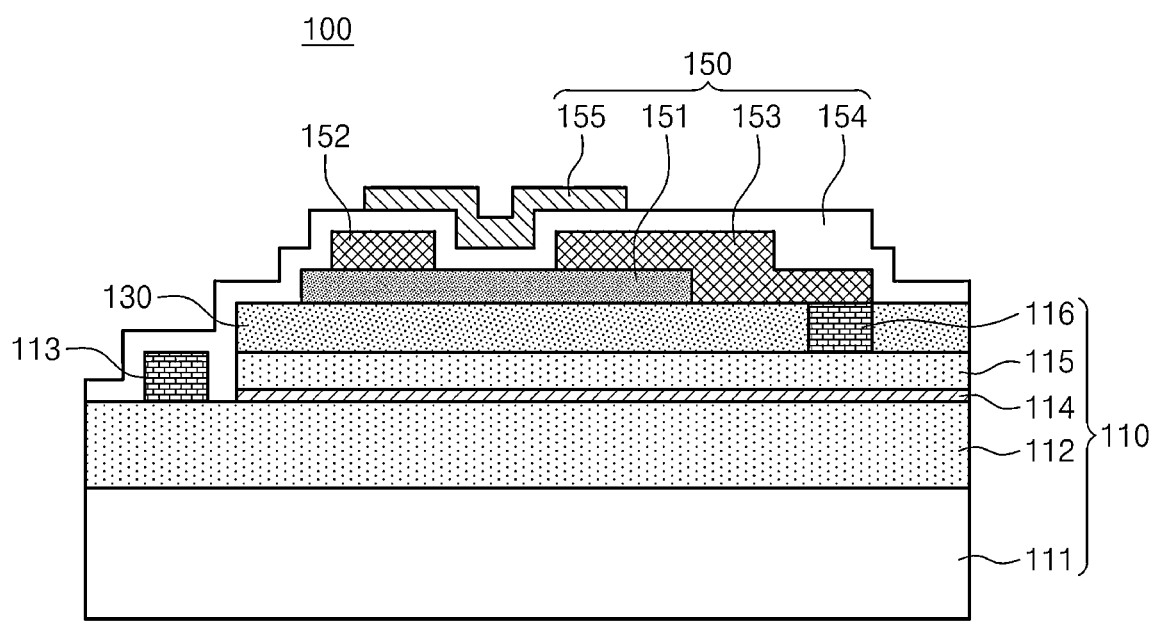
FIG. 1 illustrates a configuration diagram of a light emitting diode according to an embodiment of the inventive concept.

Hereinafter, embodiments of the inventive concept will be described in further detail with reference to the accompanying drawings but the inventive concept should not be construed as being limited to the embodiments set forth herein. The terminology used herein is for the purpose of describing particular embodiments only and is not intended to be limiting of the inventive concept. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Also, "embodiment", "example", "aspect", instance", and the like, as used herein are not intended to indicate that the described aspect or design is better or more advantageous than other aspects or designs. The terms used in the description below are selected as general and universal in the related technical field. However, there may be other terms depending on the development and/or change of technology, customs, preferences of technicians, or the like. Therefore, terms used in the following description should not be understood as limiting the technical idea, but should be understood as illustrative terms for describing embodiments.

Occasionally, some terminologies may be arbitrarily selected by the applicant(s). In this case, the meanings of the arbitrarily selected terminologies shall be described in the corresponding part of the detailed description of the specification. Therefore, terminologies used in the present specification need to be construed based on the substantial meanings of the corresponding terminologies and the overall matters disclosed in the present specification rather than construed as simple names of the terminologies. Terms, such as first, second, and the like, as used in the specification and the claims may be used herein to describe components. The components are not limited thereto. Each of the terminologies is used merely to distinguish a corresponding component from other component(s). In addition, it will be understood that when an element or layer is referred to as being "on" another element or layer, it can be directly on the other element or layer or intervening elements or layers may be present therebetween.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the inventive concept, a detailed description of known functions and configurations incorporated herein will be omitted when it may make the subject matter of the inventive concept unclear. The terms used in the specification are defined in consideration of functions used in the inventive concept, and can be changed according to the intent or conventionally used methods of clients, operators, and users. Accordingly, definitions of the terms should be understood on the basis of the entire description of the present specification.

Hereinafter, embodiments of the inventive concept will be described in detail with reference to the accompanying drawings. Referring to FIG. 1, a light emitting diode 100 integrated with a transistor of the inventive concept includes a gallium nitride (GaN)-based light emitting stacked structure 110, a first insulating layer 130 formed on gallium nitride (GaN)-based light emitting stacked structure 110, and a transition metal dichalcogenide transistor 150 formed on the first insulating layer 130.

The gallium nitride (GaN)-based light emitting stacked structure 110 includes a substrate 111, a first GaN layer 112 formed on the substrate 111, a first electrode 113 formed in a region on the first GaN layer 112, a light-emitting active layer 114 formed in another region on the first GaN layer 112, a second GaN layer 115 formed on the light-emitting active layer 114, and a second electrode 116 formed in a region on the second GaN layer 115.

The substrate 111 may be a substrate of a material commonly used in the field of light emitting diodes, may be at least one of sapphire, gallium nitride (GaN), gallium arsenide (GaAs), spinel, silicon (Si), indium phosphide (InP), and silicon carbide (SiC), and may be preferably a silicon (Si) or sapphire ($Al_2O_3$) substrate.

The first GaN layer 112 may be an n-type GaN semiconductor layer, and the first electrode 113 may be an n-type electrode. The first electrode 113 may make ohmic contact on the first GaN layer 112. The first electrode 113 may be a Cr (5 nm)/Au (40 nm) electrode. Gallium nitride is used as a core material for various optical devices due to its excellent physical and chemical characteristics. Gallium nitride grows on a growth substrate such as sapphire, silicon carbide or silicon to be used.

In addition, gallium atoms of gallium nitride used as an n-type semiconductor layer may be tetrahedral coordinated to four nitrogen atoms, respectively, and may have Ga-polar n-type semiconductor layer characteristics and N-polar n-type semiconductor layer characteristics depending on a direction. When gallium nitride grows, crystal quality should be confirmed. In particular, crystal quality may be improved by utilizing epitaxial lateral overgrowth (ELOG). In the epitaxial side overgrowth, not only gallium nitride may be grown in a vertical direction from the substrate, but also, on a masking pattern, may be grown in a lateral direction.

According to an embodiment, the first GaN layer 112 may be at least one of aluminum gallium nitride (AlGaN), indium gallium nitride (InGaN), and aluminum indium gallium nitride (AlInGaN), except for gallium nitride (GaN). A buffer layer may be formed between the substrate 111 and the first GaN layer 112. The buffer layer may alleviate lattice mismatch between the substrate 111 and the first GaN layer 112, and may allow the first GaN layer 112 to be easily grown on an upper surface of the substrate 111. The buffer layer may be made of a material capable of reducing a difference in lattice constant between the substrate 111 and the first GaN layer 112.

The buffer layer may be formed of at least one material of zinc oxide (ZnO), aluminum nitride (AlN), indium nitride (InN), tantalum nitride (TaN), titanium nitride (TiN), hafnium nitride (HfN), titanium hafnium (HfTi), gallium nitride (GaN), aluminum gallium nitride (AlGaN), aluminum indium nitride (AlInN), indium aluminum gallium nitride (InAlGaN), but is not limited thereto when the butter layer is formed of an material capable of alleviating the difference in lattice constant between the substrate 111 and the first GaN layer 112.

The light-emitting active layer 114 may have a structure in which a quantum well using a material having a small energy band gap and a quantum barrier using a material having a large energy band gap are alternately stacked at least once. The quantum well may have a single quantum well structure or a multi-quantum well (MQW) structure. In addition, indium gallium nitride (InGaN) may be used as the quantum well, and gallium nitride (GaN) may be used as the quantum barrier, but is not limited thereto.

According to an embodiment, the light-emitting active layer 114 may include at least one of indium gallium nitride (InGaN), aluminum gallium nitride (AlGaN), gallium nitride (GaN), and aluminum indium gallium nitride (AlInGaN). The second GaN layer 115 may be a p-type GaN semiconductor layer, and the second electrode 116 may be a p-type electrode. The second electrode 116 may make ohmic contact on the second GaN layer 115. The second electrode 116 may be a Cr (5 nm)/Au (40 nm) electrode.

According to an embodiment, the second GaN layer 115 may be at least one of aluminum gallium nitride (AlGaN), indium gallium nitride (InGaN), and aluminum indium gallium nitride (AlInGaN) except for gallium nitride (GaN).

The first insulating layer 130 may be formed on the second GaN layer 115 in a region where the second electrode 116 is not formed, and a thickness of the first insulating layer 130 may be the same thickness of the second electrode 116.

According to the embodiment, the first insulating layer 130 may be at least one selected from a group consisting of a silicon oxide film ($SiO_2$), a silicon nitride film (SiNx), an aluminum oxide film ($Al_2O_3$), a hafnium oxide film ($HfO_2$), a magnesium oxide film (MgO), a titanium oxide film ($TiO_2$), a tantalum oxide film ($Ta_2O_5$), a gallium oxide film ($Ga_2O_3$), and a zirconium oxide film ($ZrO_2$).

The transition metal dichalcogenide transistor 150 includes a transition metal dichalcogenide active layer 151 formed on the first insulating layer 130, a drain electrode 152 formed on the transition metal dichalcogenide active layer 151, a source electrode 153 formed on the transition metal dichalcogenide active layer 151, a second insulating layer 154 formed on the transition metal dichalcogenide active layer 151 and covering the drain electrode 152 and the source electrode 153, and a gate electrode 155 formed on the second insulating layer 154.

The transition metal dichalcogenide active layer 151 may be formed of transition metal dichalcogenides, and the transition metal chalcogenides may be a single layer or a multilayer. Compared to one-dimensional materials, two-dimensional materials are relatively easy to manufacture the complex structure and are suitable for use as materials for next-generation nanoelectronic devices. Among these two-dimensional materials, two-dimensional transition metal chalcogenides may be at least one of molybdenum disulfide ($MoS_2$), molybdenum diselenide ($MoSe_2$), and tungsten diselenide ($WSe_2$), molybdenum ditelluride ($MoTe_2$), and tin diselenide ($SnSe_2$).

The drain electrode 152 and the source electrode 153 may make ohmic contact on the transition metal dichalcogenide active layer 151, and the source electrode 153 may be electrically connected to the second electrode 116. The drain electrode 152 and the source electrode 153 may be formed of any one of a metal and a transparent conductive material. The metal may be any one of Au, Ti, Al, and Pd, but is not limited thereto, and any metal material usable in the technical field to which the inventive concept pertains is preferable. The drain electrode 152 and the source electrode 153 may be formed of, for example, Cr (5 nm)/Au (40 nm).

In addition, the transparent conductive material may be at least one of an amorphous oxide, a crystalline oxide, graphene, and a polymer organic material. The transparent conductive material may be indium zinc oxide (IZO), indium thin oxide (ITO), or graphene. The drain electrode 152 and the source electrode 153 may be formed on the transition metal dichalcogenide active layer 151 to form a trench-type structure.

The second insulating layer 154, which is a gate insulating film, may be formed to cover all regions of the first electrode 113, a region of the first GaN layer 112 on which the first electrode 113 is formed, the second electrode 116, and a region of the first insulating layer 130 on which the transition metal dichalcogenide active layer 151 is not formed, and may provide a gate electrode region in which a gate electrode to be described later is capable of being seated. Also, according to an embodiment, a thickness of the second insulating layer 154 may be 30 nm. In addition, the second insulating layer 154 may be formed to correspond to the trench-type structure of the transition metal dichalcogenide active layer 151 between the drain electrode 152 and the source electrode 153.

The second insulating layer 154 may be at least one selected from a group consisting of silicon oxide film ($SiO_2$), a silicon nitride film (SiNx), an aluminum oxide film ($Al_2O_3$), a hafnium oxide film ($HfO_2$), a magnesium oxide film (MgO), a titanium oxide film ($TiO_2$), a tantalum oxide film ($Ta_2O_5$), a gallium oxide film ($Ga_2O_3$), and a zirconium oxide film ($ZrO_2$). The gate electrode 155 may be in contact with the transition metal dichalcogenide active layer 151 between the drain electrode 152 and the source electrode 153 spaced from each other, may be formed with the second insulating layer 154 interposed between the gate electrode 155 and the transition metal dichalcogenide active layer 151, and more particularly, may be formed to be seated in the trench-type structure. By forming the gate electrode 155, the transition metal dichalcogenide transistor 150 formed on the nitride-based light emitting stacked structure 110 is manufactured. The gate electrode 155 may be formed of Cr (5 nm)/Au (40 nm).

Referring to FIGS. 2, 3A to 3G, a method of manufacturing a light emitting diode 200 integrated with a transistor of the inventive concept includes preparing a gallium nitride structure in which a substrate 211, a first GaN layer 212, a light-emitting active layer 214, and a second GaN layer 215 are sequentially stacked in S110, forming a first insulating layer 230 on the second GaN layer 215 in S120, providing a semiconductor stacked structure in which a transition metal dichalcogenide active layer 251 is formed on the first insulating layer 230 by using a metal-organic chemical vapor deposition (MOCVD) method in S130, etching a part of a top of the first GaN layer 212 of the gallium nitride structure, a part of a top of the second GaN layer 215, and a part of a top of the first insulating layer 230 using a mesa-etching method to expose the first GaN layer 212 in S140, forming a first electrode 213 and a second electrode 216 on an exposed area of the first GaN layer 212 and an exposed area of the second GaN layer 215, respectively, and forming a drain electrode 252 and a source electrode 253 on the transition metal dichalcogenide active layer 251 to be spaced from each other in S150, forming a second insulating layer 254 for covering the first electrode 213, the second electrode 216, the drain electrode 252, the source electrode 253, and an upper region of the semiconductor stacked structure in S160, and forming a gate electrode 255 on the second insulating layer 254 in S170.

Figure 3A:
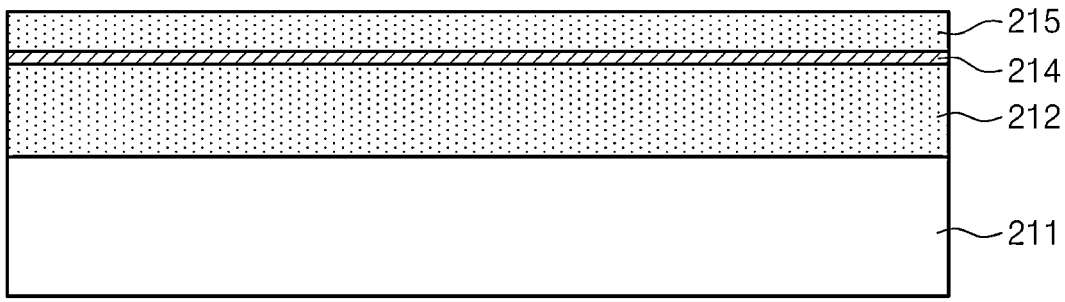
FIGS. 3A to 3G are schematic diagrams of a method of manufacturing a light emitting diode according to an embodiment of the inventive concept.

Referring to FIG. 3A, S110 may include depositing the first GaN layer 212 on the substrate 211, depositing the light-emitting active layer 214 on the first GaN layer 212, and depositing the second GaN layer 215 on the light-emitting active layer 214. S110 may be performed by MOCVD method, and is preferably performed at 1000° C. or more.

The substrate 211 may be a substrate of a material commonly used in the field of light emitting diodes, may be at least one of sapphire, gallium nitride (GaN), gallium arsenide (GaAs), spinel, silicon (Si), indium phosphide (InP), and silicon carbide (SiC), and may be preferably a silicon (Si) or sapphire ($Al_2O_3$) substrate.

The first GaN layer 212 may be an n-type semiconductor layer. Gallium nitride is used as a core material for various optical devices due to its excellent physical and chemical characteristics. Gallium nitride grows on a growth substrate such as sapphire, silicon carbide, or silicon by heterogeneous epitaxial, to be used. Gallium atoms of gallium nitride used as an n-type semiconductor layer may be tetrahedral coordinated to four nitrogen atoms, respectively, and may have Ga-polar n-type semiconductor layer characteristics and N-polar n-type semiconductor layer characteristics depending on a direction.

When gallium nitride grows, crystal quality should be confirmed. In particular, crystal quality may be improved by utilizing epitaxial lateral overgrowth (ELOG). In the epitaxial side overgrowth, not only gallium nitride may be grown in a vertical direction from the substrate, but also, on a masking pattern, may be grown in a lateral direction.

According to an embodiment, the first GaN layer 212 may be at least one of aluminum gallium nitride (AlGaN), indium gallium nitride (InGaN), and aluminum indium gallium nitride (AlInGaN), except for gallium nitride (GaN).

The light-emitting active layer 214 may have a structure in which a quantum well using a material having a small energy band gap and a quantum barrier using a material having a large energy band gap are alternately stacked at least once. The quantum well may have a single quantum well structure or a multi-quantum well (MQW) structure. In addition, indium gallium nitride (InGaN) may be used as the quantum well, and gallium nitride (GaN) may be used as the quantum barrier, but is not limited thereto.

According to an embodiment, the light-emitting active layer 214 may include at least one of indium gallium nitride (InGaN), aluminum gallium nitride (AlGaN), gallium nitride (GaN), and aluminum indium gallium nitride (AlInGaN).

The second GaN layer 215 may be a p-type GaN semiconductor layer, and according to an embodiment, the second GaN layer may be at least one of aluminum gallium nitride (AlGaN), indium gallium nitride (InGaN), and aluminum indium gallium nitride (AlInGaN) except for gallium nitride (GaN).

Figure 2:
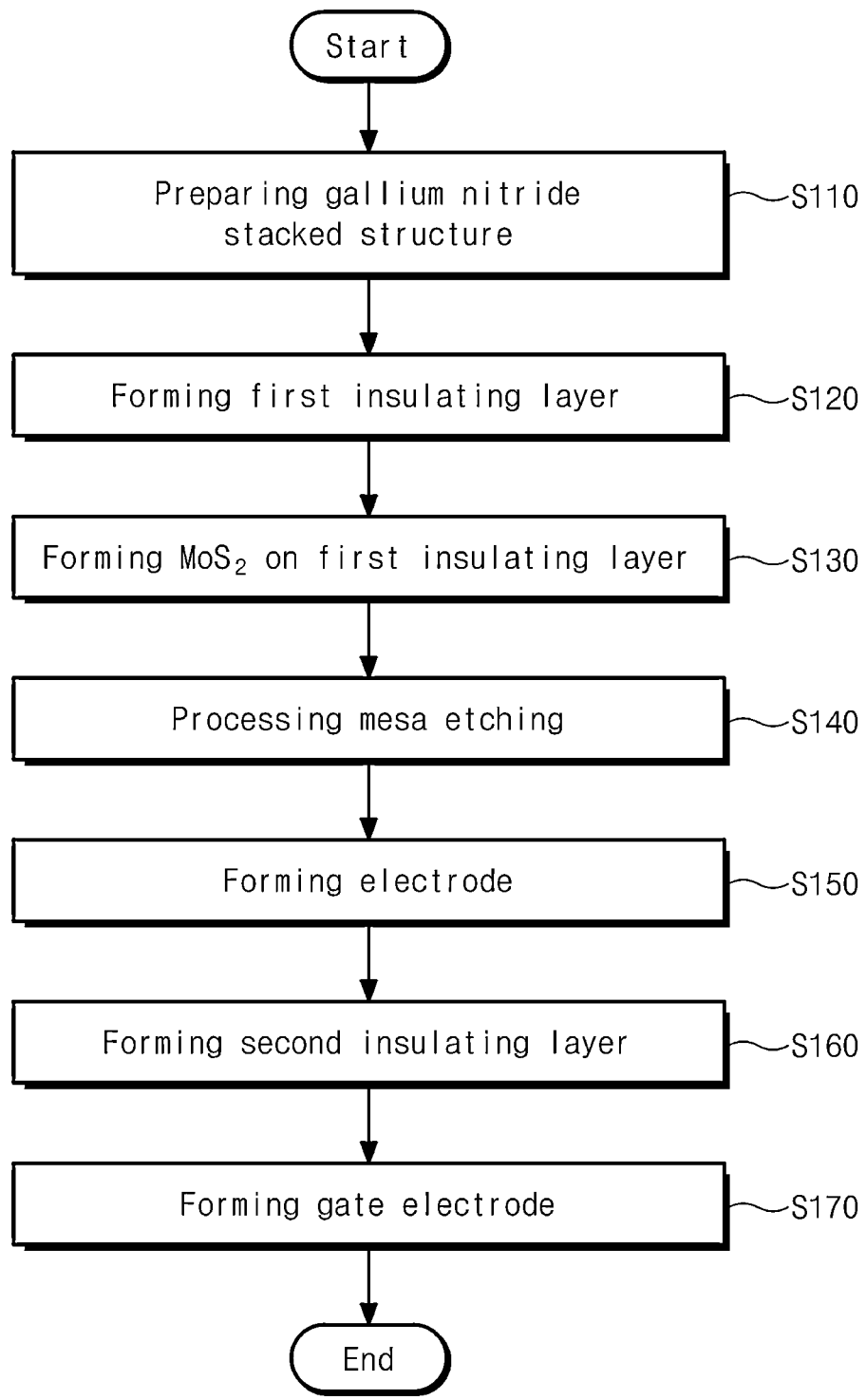
FIG. 2 is a flowchart illustrating a method of manufacturing a light emitting diode according to an embodiment of the inventive concept.
Figure 3B:
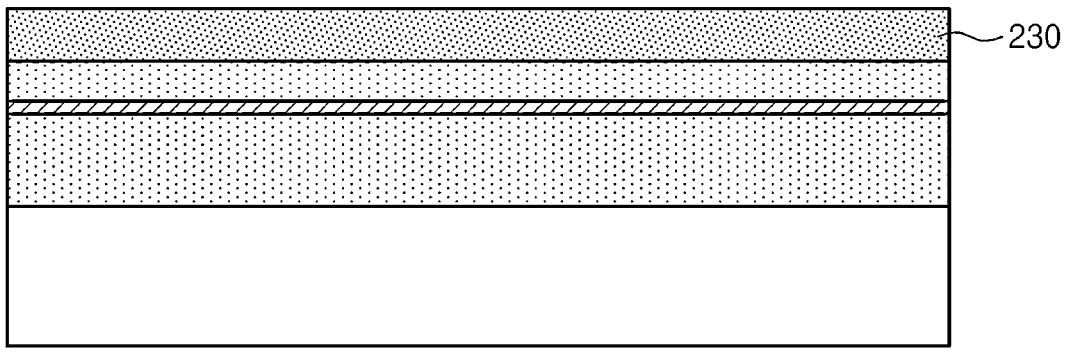

Referring to FIGS. 2 and 3B, in S120, the first insulating layer 230 may be at least one selected from a group consisting of a silicon oxide film ($SiO_2$), a silicon nitride film (SiNx), an aluminum oxide film ($Al_2O_3$), a hafnium oxide film ($HfO_2$), a magnesium oxide film (MgO), a titanium oxide film ($TiO_2$), a tantalum oxide film ($Ta_2O_5$), a gallium oxide film ($Ga_2O_3$), and a zirconium oxide film ($ZrO_2$).

Figure 3C:
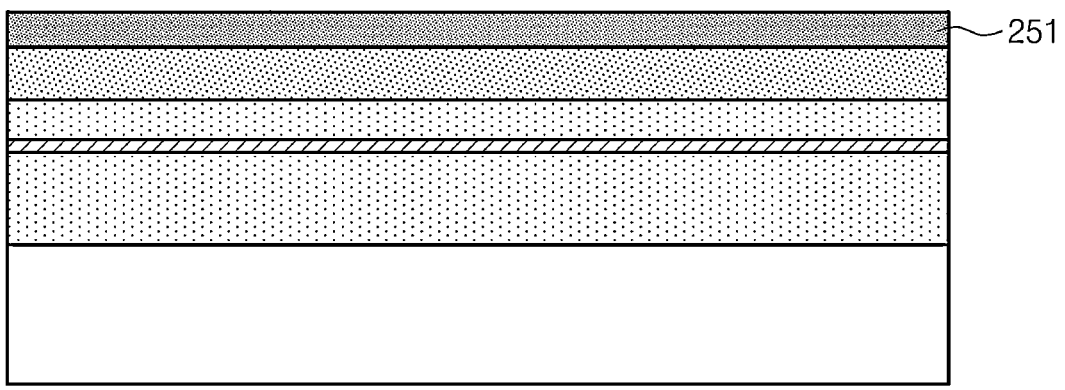

Referring to FIGS. 2 and 3C, in S130, a formation of the transition metal dichalcogenide active layer 251 is preferably performed under conditions that do not affect the gallium nitride-based structure, and the transition metal dichalcogenide active layer 251 may be formed at 700° C. or less, and preferably 600° C. or less. The transition metal dichalcogenide may be formed in an atomic layer thickness using MOCVD. Here, the transition metal dichalcogenide active layer 251 may be formed to have a thin thickness within several nm without affecting the gallium nitride-based structure at the temperature of 700° C. or less.

The transition metal dichalcogenide active layer 251 may be formed of transition metal chalcogenides, and the transition metal chalcogenides may be a single layer or a multilayer. Compared to one-dimensional materials, two-dimensional materials are relatively easy to manufacture the complex structure and are suitable for use as materials for next-generation nanoelectronic devices. Among these two-dimensional materials, two-dimensional transition metal chalcogenides may be at least one of molybdenum disulfide ($MoS_2$), molybdenum diselenide ($MoSe_2$), and tungsten diselenide ($WSe_2$), molybdenum ditelluride ($MoTe_2$), and tin diselenide ($SnSe_2$).

Figure 3D:
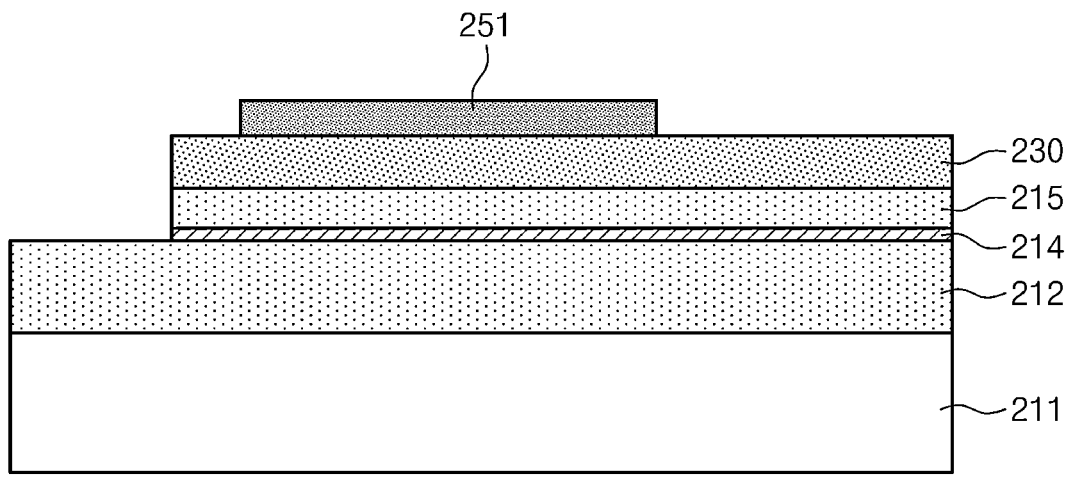

Referring to FIGS. 2 and 3D, in S140, the transition metal dichalcogenide active layer 251, the first insulating layer 230, the second GaN layer 215, and the light-emitting active layer 214 are etched by the mesa etching to expose a part of the first GaN layer 212. Then, the transition metal dichalcogenide active layer 251 and the first insulating layer 230 are etched to expose a part of the second GaN layer 215. The order of mesa etching may be changed. A first electrode and a second electrode to be described later may be formed in each of the regions exposed through mesa etching. Exposed regions other than the first electrode and the second electrode may be coated with a second insulating layer to be described later.

Figure 3E:
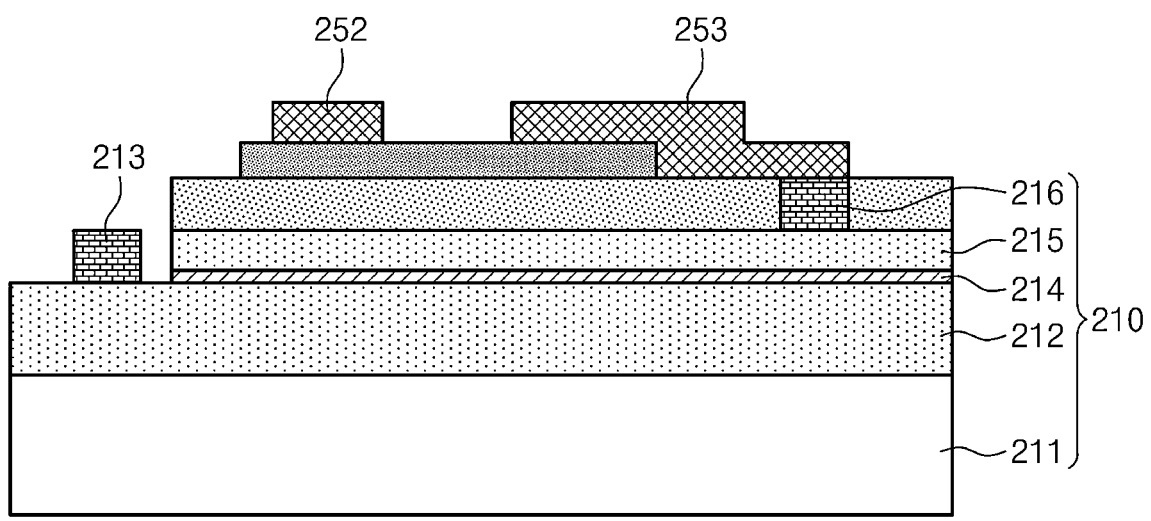

Referring to FIGS. 2 and 3E, in S150, the first electrode 213 may be an n-type electrode, and the second electrode 216 may be a p-type electrode. Each of the first electrode 213 and the second electrode 216 may be a Cr (5 nm)/Au (40 nm) electrode. By forming the first electrode 213 and the second electrode 216, the gallium nitride (GaN)-based light emitting stacked structure 210 may be formed, which may operate as a light emitting diode device.

In S150, the drain electrode 252 and the source electrode 253 may be formed of any one of a metal and a transparent conductive material. The metal may be any one of Au, Ti, Al, and Pd, but is not limited thereto, and any metal material usable in the technical field to which the inventive concept pertains is preferable. In addition, the transparent conductive material may be at least one of an amorphous oxide, a crystalline oxide, graphene, and a polymer organic material.

According to an embodiment, the drain electrode 252 and the source electrode 253 may be made of a transparent conductive material, and transparent conductive material may be indium zinc oxide (IZO), indium thin oxide (ITO), or graphene. Also, preferably, the drain electrode 252 and the source electrode 253 may be formed of Cr (5 nm)/Au (40 nm).

The drain electrode 252 and the source electrode 253 may be formed on the transition metal dichalcogenide active layer 251 to form a trench-type structure. The first electrode 213, the second electrode 216, the drain electrode 252, and the source electrode 253 may be formed by evaporation, respectively, and may be formed by thermal evaporation or electron beam (E-beam) evaporation.

Figure 3F:
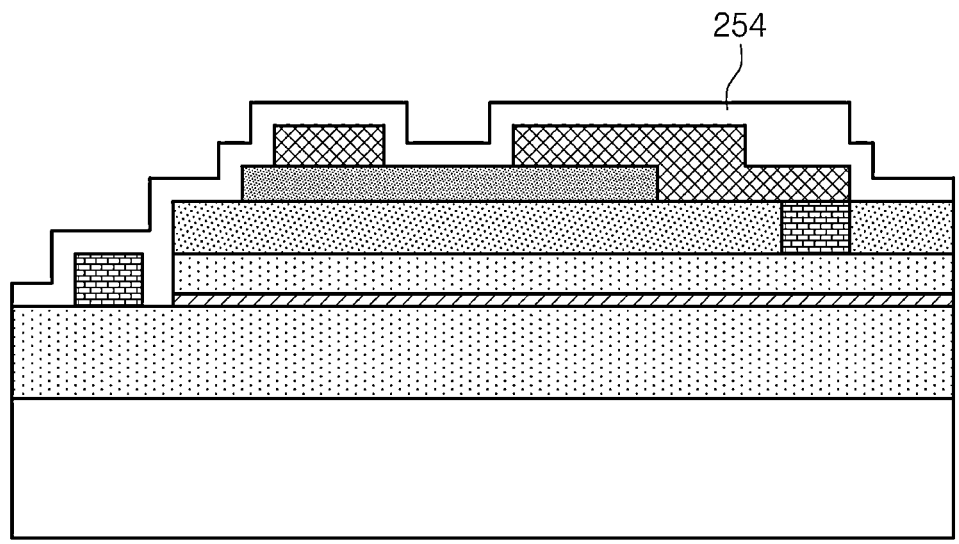

Referring to FIGS. 2, 3E, and 3F, in S160, it is preferable that the second insulating layer 254 is formed to cover all regions of the exposed area of the first GaN layer 212 and the exposed area of the first insulating layer 230 by the mesa etching in S140 of FIG. 2 and FIG. 3D. The second insulating layer 254 may be formed on the transition metal dichalcogenide active layer 251 between the drain electrode 252 and the source electrode 253 to correspond to a trench-type structure. The second insulating layer 254, which is a gate insulating film, may provide a gate electrode region in which a gate electrode to be described later is capable of being seated.

In S160, the second insulating layer 254 may be at least one selected from a group consisting of silicon oxide film ($SiO_2$), a silicon nitride film (SiNx), an aluminum oxide film ($Al_2O_3$), a hafnium oxide film ($HfO_2$), a magnesium oxide film (MgO), a titanium oxide film ($TiO_2$), a tantalum oxide film ($Ta_2O_5$), a gallium oxide film ($Ga_2O_3$), and a zirconium oxide film ($ZrO_2$), and the second insulating layer 254 may have a thickness of 30 nm.

Figure 3G:
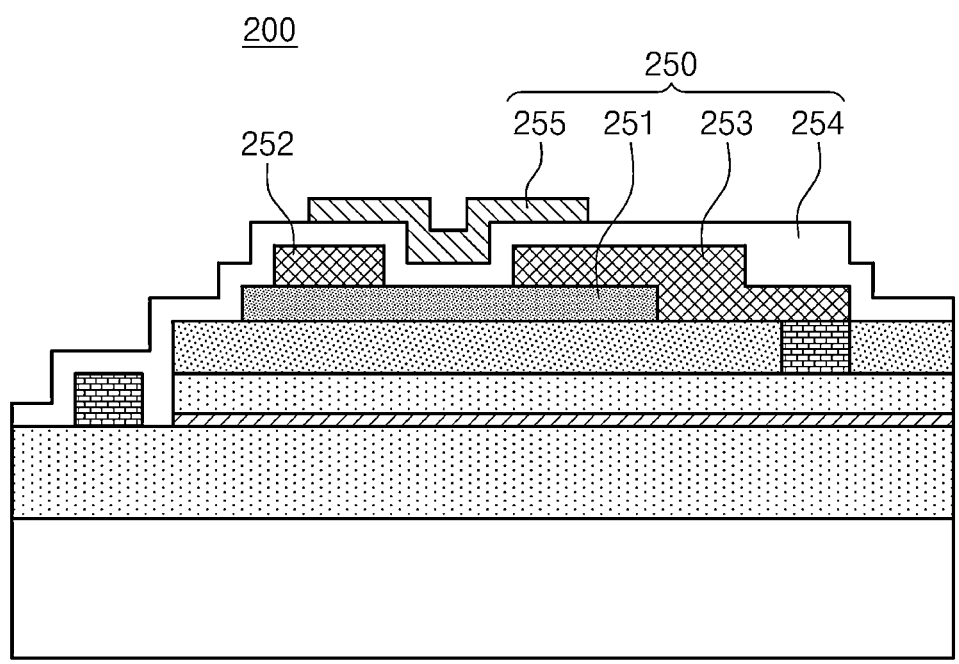

Referring to FIGS. 2 and 3G, in S170, the gate electrode 255 may be formed to be in contact with the transition metal dichalcogenide active layer 251 spaced between the drain electrode 252 and the source electrode 253. The gate electrode 255 may be formed of Cr (5 nm)/Au (40 nm). The second insulating layer 254 may be formed between the gate electrode 255 and the transition metal dichalcogenide active layer 251, and in particular, the gate electrode 255 may be formed to be seated in the trench-type structure. By forming the gate electrode 255, the transition metal dichalcogenide transistor 250 formed on the nitride-based light emitting stacked structure 210 is manufactured.

Hereinafter, the inventive concept will be described in more detail through examples. These examples are for explaining the inventive concept more specifically, and the scope of the inventive concept is not limited by these examples.

Example 1

Figure 4:
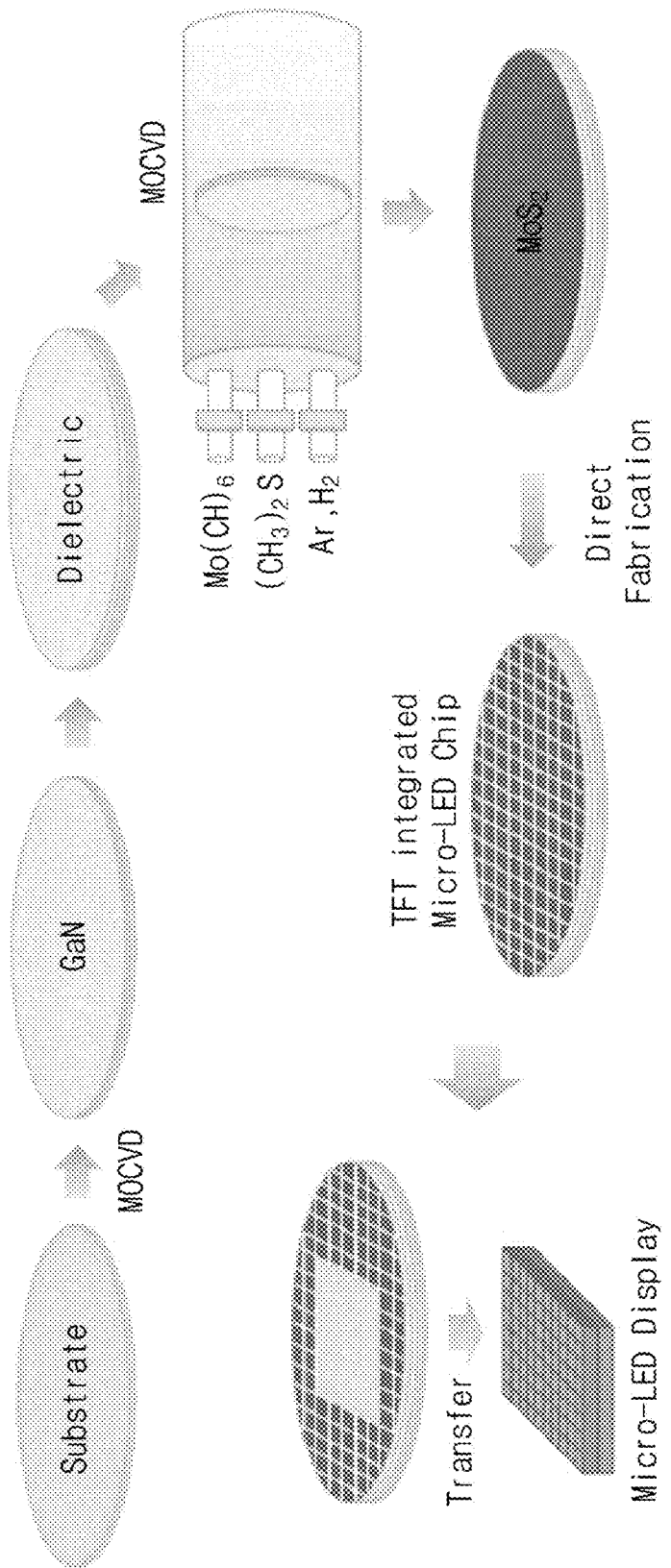
FIG. 4 is a view illustrating a method of manufacturing a light emitting diode according to an embodiment of the inventive concept.

Referring to FIG. 4, a silicon (Si) wafer is prepared as a substrate, and an n-GaN layer, an MQW (InGaN/GaN) layer, and a p-GaN layer are deposited in order through metal organic chemical vapor deposition (MOCVD) at a temperature of 1000° C. or more on the silicon wafer, to form a light emitting diode semiconductor layer.

Then, after applying $Al_2O_3$ as an insulator on the GaN epi wafer, $Mo(CH)_6$ and $(CH_3)_2S$ are supplied as raw materials on $Al_2O_3$, and $MoS_2$ is deposited by MOCVD at a temperature of 600° C. or less in an Ar and $H_2$ atmosphere, to form a transistor semiconductor active layer, thereby fabricating a semiconductor stacked structure.

Thereafter, the $MoS_2$ layer is etched by reactive-ion etching (RIE) to expose a part of the $Al_2O_3$ insulating layer, and then the $Al_2O_3$ layer, the p-type GaN layer, and the MQW layer are simultaneously etched to expose a part of the n-type GaN layer.

An n-type electrode (Cr 5 nm/Au 40 nm) is formed in the exposed area of the n-type GaN layer, and a p-type electrode (Cr 5 nm/Au 40 nm) is formed in the p-type GaN layer, thereby fabricating an LED. A drain electrode (Cr 5 nm/Au 40 nm) and a source electrode (Cr 5 nm/Au 40 nm) separated by a certain distance are formed on the $MoS_2$ layer.

Then, after applying an $Al_2O_3$ layer as a gate insulating film to have a thickness of 30 nm on the entire area of the semiconductor stacked structure in which each electrode is formed, a gate electrode (Cr 5 nm/Au 40 nm) is formed on the $Al_2O_3$ layer region of a gate trench structure covering the $MoS_2$ layer, the drain electrode, and the source electrode, thereby fabricating a TFT integrated micro-LED chip and then fabricating a micro LED display therefrom.

Figure 5:
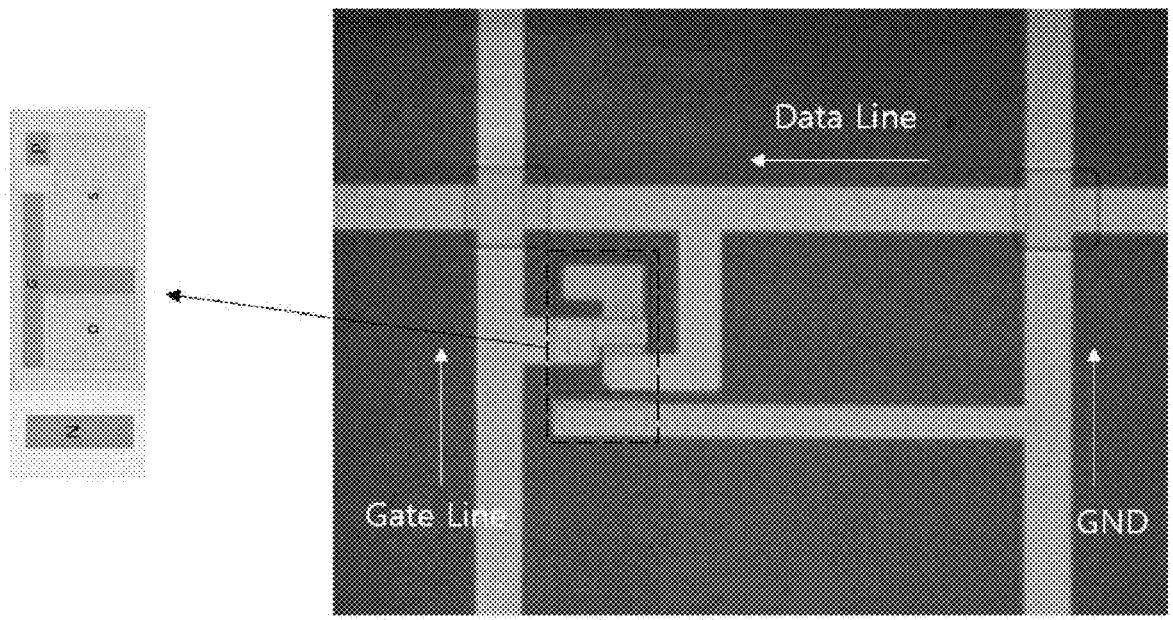
FIG. 5 illustrates optical microscopy images of a light emitting diode according to an embodiment of the inventive concept.
Figure 6:
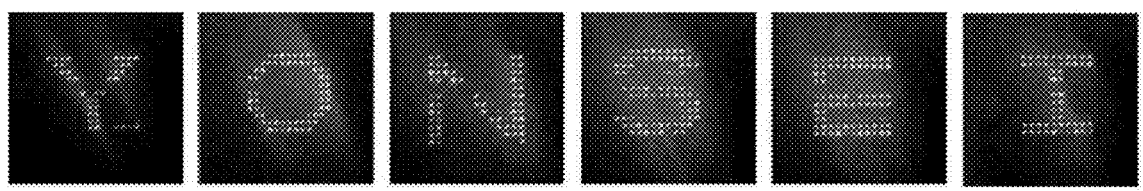
FIG. 6 continuously illustrates a driving image of a light emitting diode according to an embodiment of the inventive concept.

FIG. 5 illustrates optical microscopy images of a light emitting diode manufactured according to Example 1 above, and referring to an enlarged schematic diagram of a portion indicated by a dotted line in FIG. 5 (a left image of FIG. 5), it may be confirmed that the n-type electrode N, the p-type electrode P, the drain electrode D, the source electrode S, and the gate electrode G are deposited. FIG. 6 continuously illustrates a driving image in which the light emitting diode manufactured according to Example 1 is implemented as a 16×16 active matrix array, and it may be confirmed that 'Y', 'O', 'N', 'S', 'E', and 'I' are clearly observed from left to right in FIG. 6.

Example 2

A sapphire wafer is prepared as a substrate, and an n-GaN layer, an MQW (InGaN/GaN) layer, and a p-GaN layer are deposited through metal organic chemical vapor deposition (MOCVD) at a temperature of 1000° C. or more on the sapphire wafer, to form a light emitting diode semiconductor layer.

Thereafter, after forming $SiO_2$ as an insulator on the p-GaN layer, $Mo(CH)_6$ and $(CH_3)_2S$ are supplied as raw materials on $SiO_2$, and $MoS_2$ is deposited by MOCVD at a temperature of 600° C. or less in an Ar and $H_2$ atmosphere, to form a transistor semiconductor active layer, thereby fabricating a semiconductor stacked structure.

Thereafter, the $MoS_2$ layer is etched by reactive-ion etching (RIE) to expose a part of the $SiO_2$ insulating layer, and then the $SiO_2$ layer, the p-type GaN layer, and the MQW layer are simultaneously etched to expose a part of the n-type GaN layer, thereby processing chip isolation.

An n-type electrode (Cr 5 nm/Au 40 nm) is formed in the exposed area of the n-type GaN layer, and a p-type electrode (Cr 5 nm/Au 40 nm) is formed in the p-type GaN layer, thereby fabricating an LED. A drain electrode (Cr 5 nm/Au 40 nm) and a source electrode (Cr 5 nm/Au 40 nm) separated by a certain distance are formed on the $MoS_2$ layer.

Then, after applying an $Al_2O_3$ layer as a gate insulating film to have a thickness of 30 nm on the entire area of the semiconductor stacked structure in which each electrode is formed, a gate electrode (Cr 5 nm/Au 40 nm) is formed on the $Al_2O_3$ layer region of a gate trench structure covering the $MoS_2$ layer, the drain electrode, and the source electrode, thereby fabricating a TFT integrated micro-LED chip and then fabricating a micro LED display therefrom. Here, as an example, after removing the sapphire substrate by a laser lift-off (LLO) method, the micro-LED array may be transfer printed to a flexible substrate such as polyethylene terephthalate (PET) substrate or a polyethylene terephthalate (PI) substrate using a roll transfer method.

Figure 7:
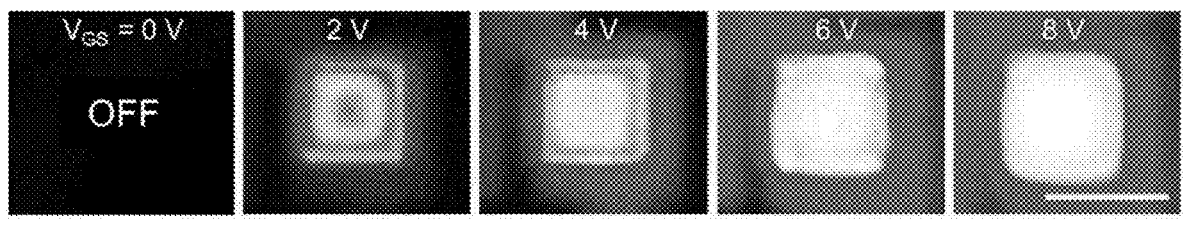
FIG. 7 illustrates bottom emission driving images of gate-controlled light emitting diode according to an embodiment of the inventive concept.

FIG. 7 illustrates bottom emission driving images of gate-controlled light emitting diode according to Example 2 and illustrates images of a change in electroluminescence depending on a gate-source voltage. The ground voltage is applied as a source voltage. When the gate voltage is less than 2 V, the micro LED is turned off. As the gate voltage increased, it may be seen that light emission intensity increases and the $MoS_2$ TFT has excellent gate controllability.

Figure 8:
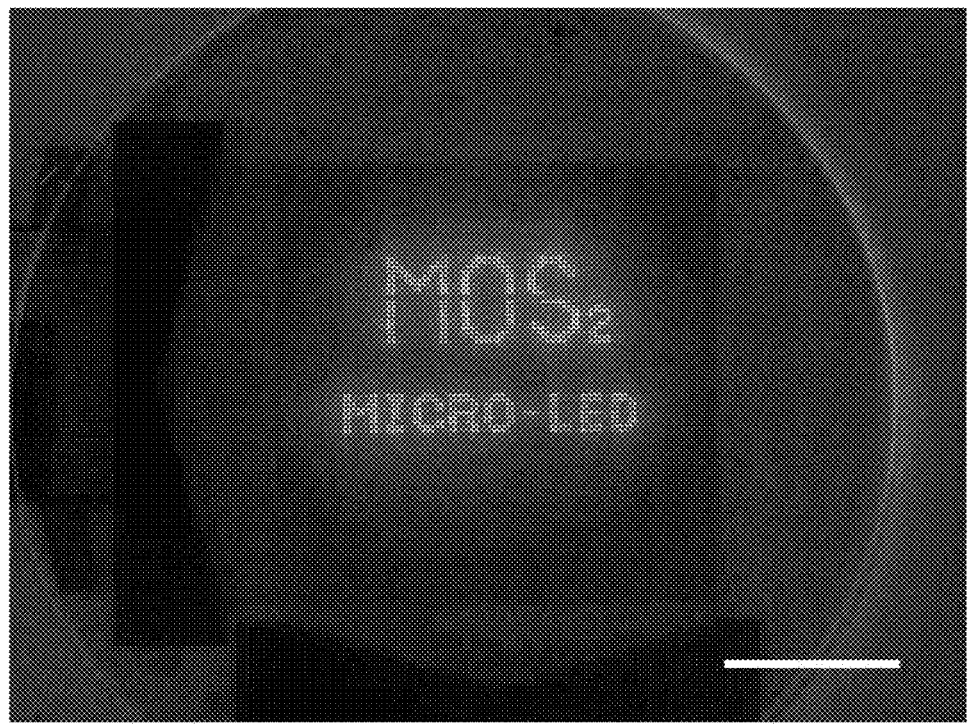
FIG. 8 illustrates a driving image of a micro light emitting diode display according to an embodiment of the inventive concept.

FIG. 8 illustrates a driving image of a micro light emitting diode display according to an embodiment of the inventive concept, and illustrates an image in which characters are displayed using an active-matrix micro-LED display manufactured on a sapphire substrate according to Example 2. The active-matrix micro-LED display may be manufactured by connecting unit pixels in a matrix form and connecting them to an external driving circuit. As illustrated in FIG. 8, it may be seen that the "MoS$_2$ MICRO-LED" character is clearly displayed.

According to one embodiment of the inventive concept, the transition metal dichalcogenide is formed on the light emitting diode device, thereby providing the light emitting diode integrated with the transistor without affecting the characteristics of the light emitting diode device.

In addition, the transistor is integrated into the light emitting diode device, and thus it is possible to transfer the transistor and the light emitting diode at once, thereby reducing the production cost and facilitating alignment.

In addition, the transistor is vertically integrated on the light emitting diode device, and thus it is possible to reduce the area occupied by the transistor, to implement the high ppi (pixels per inch), and to reduce the parasitic resistance and parasitic capacitance generated when the light emitting diode device and the transistor wire are connected.

Further, the transition metal dichalcogenide according to the inventive concept having the flexible and transparent characteristics is exfoliated from the substrate together with the light emitting diode layer, and thus it is possible to apply the thin-film transistor to the flexible micro LED display.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A light emitting diode integrated with a transistor, the light emitting diode comprising:
    a light-emitting stacked structure based on gallium nitride (GaN);
    a first insulating layer formed on the light-emitting stacked structure; and
    a transition metal dichalcogenide transistor formed on the first insulating layer,
    wherein the transition metal dichalcogenide transistor includes:
    a transition metal dichalcogenide active layer formed on the first insulating layer;
    a drain electrode formed on the transition metal dichalcogenide active layer;
    a source electrode formed on the transition metal dichalcogenide active layer;
    a second insulating layer formed on the transition metal dichalcogenide active layer and covering the drain electrode and the source electrode; and
    a gate electrode formed on the second insulating layer.

2. The light emitting diode of claim 1, wherein the light-emitting stacked structure based on gallium nitride (GaN) includes:
    a substrate;
    a first GaN layer formed on the substrate;
    a first electrode formed in a region on the first GaN layer;
    a light-emitting active layer formed in another region on the first GaN layer;
    a second GaN layer formed on the light-emitting active layer; and
    a second electrode formed in a region on the second GaN layer.

3. The light emitting diode of claim 2, wherein the first insulating layer is formed on a region on the second GaN layer in which the second electrode is not formed.

4. The light emitting diode of claim 2, wherein the second electrode makes ohmic contact on the second GaN layer, and the source electrode is electrically connected to the second electrode.

5. The light emitting diode of claim 2, wherein the first insulating layer has a thickness identical to a thickness of the second electrode.

6. The light emitting diode of claim 2, wherein the second insulating layer is formed to cover all of the first electrode, a region of the first GaN layer in which the first electrode is formed, the second electrode, and a region of the first insulating layer in which the transition metal dichalcogenide active layer is not formed.

7. The light emitting diode of claim 2, wherein the second insulating layer has a gate electrode region in which the gate electrode is capable of being seated.

8. The light emitting diode of claim 1, wherein the transition metal dichalcogenide active layer includes at least one material selected from a group consisting of molybdenum disulfide (MoS$_2$), molybdenum diselenide (MoSe$_2$), and tungsten diselenide (WSe$_2$), molybdenum ditelluride (MoTe$_2$), and tin diselenide (SnSe$_2$).

9. A method of manufacturing a light emitting diode integrated with a transistor, the method comprising:
    preparing a gallium nitride (GaN) stacked structure in which a substrate, a first GaN layer, a light-emitting active layer, and a second GaN layer are sequentially stacked;
    forming a first insulating layer on the second GaN layer;
    providing a semiconductor stacked structure in which a transition metal dichalcogenide active layer is formed on the first insulating layer by using MOCVD method;
    etching a part of a top of the first GaN layer, a part of a top of the second GaN layer, and a part of a top of the first insulating layer of the gallium nitride stacked structure using mesa etching to expose the first GaN layer;
    forming a first electrode on the exposed region of the first GaN layer, a second electrode on the exposed region of the second GaN layer, and a drain electrode and a source electrode which are separated from each other on the transition metal dichalcogenide active layer;
    forming a second insulating layer for covering the first electrode, the second electrode, the drain electrode, the source electrode, and an upper region of the semiconductor stacked structure; and
    forming a gate electrode on the second insulating layer.

10. The method of claim 9, wherein the transition metal dichalcogenide active layer includes at least one material selected from a group consisting of molybdenum disulfide (MoS$_2$), molybdenum diselenide (MoSe$_2$), and tungsten diselenide (WSe$_2$), molybdenum ditelluride (MoTe$_2$), and tin diselenide (SnSe$_2$).

11. The method of claim 9, wherein the forming of the transition metal dichalcogenide active layer is carried out at 700° C. or less.

12. The method of claim 9, wherein the first insulating layer is formed on a region on the second GaN layer in which the second electrode is not formed.

13. The method of claim 9, wherein the second electrode is formed to make ohmic contact on the second GaN layer, and the source electrode is formed to be electrically connected to the second electrode.

14. The method of claim 9, wherein the first insulating layer has a thickness identical to a thickness of the second electrode.

15. The method of claim 9, wherein the second insulating layer is formed to cover all of the first electrode, a first GaN layer region in which the first electrode is formed, the second electrode, and a first insulating layer region in which the transition metal dichalcogenide active layer is not formed.

16. The method of claim 9, wherein the second insulating layer is formed to have a gate electrode region in which the gate electrode is capable of being seated.

\* \* \* \* \*